United States Patent
Pellizzer et al.

(10) Patent No.: US 8,885,382 B2
(45) Date of Patent: Nov. 11, 2014

(54) COMPACT SOCKET CONNECTION TO CROSS-POINT ARRAY

(75) Inventors: Fabio Pellizzer, Cornate d'Adda (IT); Antonino Rigano, Pioltello (IT); Gianfranco Capetti, Concorezzo (IT)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 13/538,880

(22) Filed: Jun. 29, 2012

(65) Prior Publication Data

US 2014/0003114 A1    Jan. 2, 2014

(51) Int. Cl.
*G11C 5/06* (2006.01)

(52) U.S. Cl.
USPC .......................................................... 365/63

(58) Field of Classification Search
CPC .......................................................... G11C 5/06
USPC .......................................................... 365/63
See application file for complete search history.

(56) References Cited

U.S. PATENT DOCUMENTS

| | | | | |
|---|---|---|---|---|
| 2005/0174015 A1* | 8/2005 | Scott | | 310/334 |
| 2008/0232160 A1* | 9/2008 | Gopalakrishnan | | 365/163 |
| 2009/0267042 A1* | 10/2009 | Happ et al. | | 257/2 |
| 2010/0163822 A1 | 7/2010 | Ovshinsky et al. | | |
| 2010/0232200 A1* | 9/2010 | Shepard | | 365/51 |
| 2011/0215436 A1 | 9/2011 | Tang et al. | | |
| 2011/0227023 A1* | 9/2011 | Bethune et al. | | 257/4 |
| 2011/0278527 A1 | 11/2011 | Ishibashi | | |
| 2011/0278528 A1 | 11/2011 | Lung et al. | | |
| 2012/0106252 A1* | 5/2012 | Ozaki et al. | | 365/185.05 |
| 2012/0243291 A1* | 9/2012 | Gopalakrishnan | | 365/145 |
| 2013/0044532 A1* | 2/2013 | Bethune et al. | | 365/148 |
| 2013/0250650 A1* | 9/2013 | Sasaki | | 365/148 |
| 2013/0322153 A1* | 12/2013 | Burr et al. | | 365/148 |

FOREIGN PATENT DOCUMENTS

| | | |
|---|---|---|
| JP | 2009-130140 A | 6/2009 |
| JP | 2011-071207 A | 4/2011 |
| JP | 2012-099627 A | 5/2012 |
| KR | 10-2008-0000505 A | 1/2008 |
| WO | 2014004693 A1 | 1/2014 |

OTHER PUBLICATIONS

Bez, Roberto, "Phase Change Memory: State of the Art and Perspective," 11th Leti Annual Review, Jun. 22-24, 2009, (34 pp).

Kau, Derchang et al., "A stackable cross point phase change memory," Electron Devices Meeting (IEDM), 2009, IEEE International, Dec. 7-9, 2009 (4 pp).

(Continued)

*Primary Examiner* — Hoai V Ho
*Assistant Examiner* — Pablo Huerta
(74) *Attorney, Agent, or Firm* — Cool Patent, P.C.

(57) ABSTRACT

An integrated circuit may include lines that traverse a cross-point array, the lines fabricated at a first pitch on a first layer, wherein the first pitch is sub-lithographic, and leads on a second layer, the leads having a second pitch that is twice as large as the first pitch. The lines may be routed outside of the array in alternating groups to opposite sides of the array where the lines couple to the leads.

30 Claims, 8 Drawing Sheets

(56) References Cited

OTHER PUBLICATIONS

Malventano, Allyn, "Intel and Numonyx announce vertical Phase Change Memory," PC Perspective, Oct. 28, 2009, retrieved from http://www.pcper.com/news/Storage/Intel-and-Numonyx-announce-vertical-Phase-Change-Memory on Jul. 13, 2012 (4 pp).
Savage, Neil, "Numonyz Makes Stackable Phase-Change Memory", IEEE Spectrum, Nov. 17, 2009, retrieved from http:/spectrum.ieee.org/semiconductors/memory/numonyx-makes-stackable-phasechange-memory on Jul. 13, 2012 (3 pp).
Wong, H.-S Philip, "Emerging Memories", Department of Electrical Engineering, Stanford University, Stanford, CA, Apr. 3, 2008 (77 pp).
Pellizzer, Fabio, et al. "Memory Arrays and Methods of Forming Same," Unpublished U.S. Appl. No. 13/358,882, filed Jan. 26, 2012.
International Search Report and Written Opinion Received for PCT Patent Application No. PCT/US2013/047931, mailed on Oct. 18, 2013, 13 pages.

* cited by examiner

US 8,885,382 B2

COMPACT SOCKET CONNECTION TO CROSS-POINT ARRAY

BACKGROUND

1. Technical Field

The present subject matter relates to semiconductor memories, and more particularly, to connecting lines from a cross point array to surrounding circuitry.

2. Background Art

Memory for computers or other electronic devices can include blocks of memory cells integrated into a larger integrated circuit or stand-alone integrated circuits. There are many different types of memory including random-access memory (RAM), read only memory (ROM), dynamic random access memory (DRAM), static RAM (SRAM), synchronous dynamic RAM (SDRAM), flash memory and phase change memory. Phase change memory devices utilize materials that have different electrical properties in their crystalline and amorphous phases. Each phase change memory cell may be programmed by putting the material in the memory cell into either a crystalline phase or an amorphous phase providing non-volatile memory that does not require power to retain its contents. Phase change memories are often programmed using heat generated by an electrical current to control the state of the phase change material.

Phase change memory arrays may be organized as a true cross-point array where the control lines, which may be referred to as bit lines and/or word lines, may be routed at a regular pitch across large portions, or even the entire, array. Some phase change memory arrays may be organized in a three-dimensional (3D) fashion, with multiple arrays stacked on each other. Such 3D arrays may use a single set of control lines to couple to two different layers of the memory array to minimize routing complexity.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

One of the major challenges of PCMS cross-point architectures for high density applications is the connection with the underlying CMOS circuitry, which may built before processing the array. This disclosure describes methods to terminate and/or route control lines, or array lines, such as word lines, or bit lines, which may be fabricated using pitch-doubling techniques, and to couple the control lines to the CMOS circuitry using metal layers that may be available beneath the array or outside of the array, that may have been fabricated before the array is formed.

Figure 1:
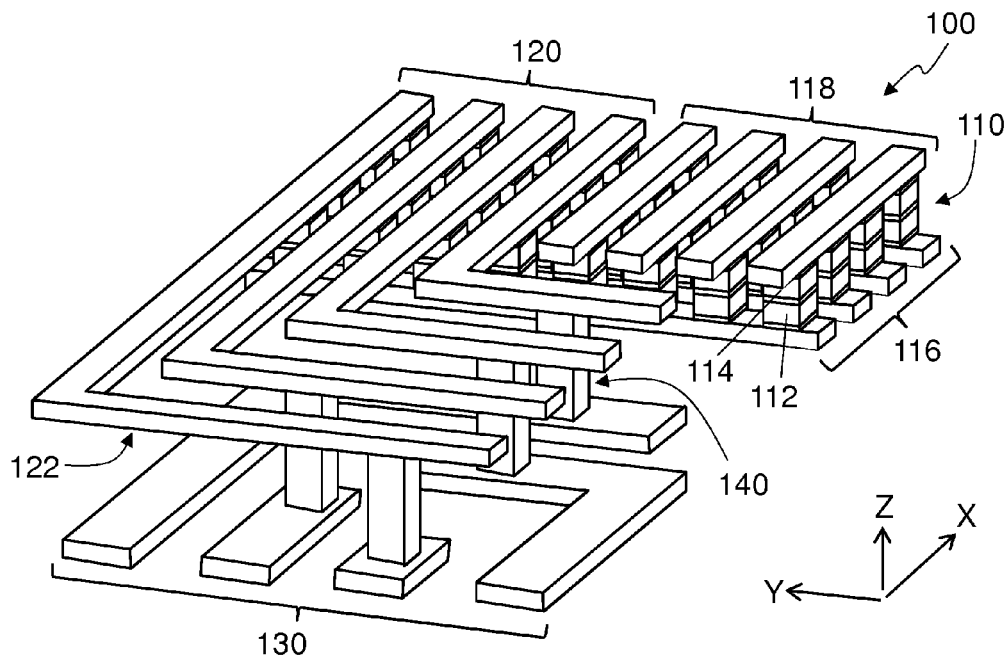
FIG. 1 is a perspective view of a portion of an embodiment of a compact socket connection to a cross-point array.

FIG. 1 is a perspective view of a portion of an embodiment of a compact socket connection to a cross-point array 110. An integrated circuit (IC) 100 may include a cross-point array 110 of memory cells. The IC 100 may be built on a substrate (not shown), which may include various circuits that may be fabricated before the memory array 110 is constructed in some embodiments. Various embodiments may utilize different non-volatile or volatile memory technologies for some or all of memory cells. Examples of non-volatile memory technologies that may be used include, but are not limited to, flash memory, mask programmable read only memory (ROM), optically erasable programmable read only memory (EPROM), nanowire based memory, ferro-electric transistor random access memory (FeTRAM), phase-change memory (PCM), and PCM with switch (PCMS). Examples of volatile memory technologies that may be used include various types of dynamic random access memory (DRAM), and static random access memory (SRAM). Any type of memory organized as a cross-point array may be used.

A cross array is an array having at least one set of control lines that traverse the array at a regular pitch for large areas of the array, or even over the entire array. Some memory architectures may include a set of lines at a regular pitch with a larger space between the lines after some number of lines that may be related to the block size or word size of the memory array. In a cross-point array, a memory cell may be coupled between a unique pair of control lines. In a cross-point array, dozens, hundreds, or even thousands, of control lines may traverse the array at a regular pitch.

In some semiconductor process technologies, a line and a space may have the same minimum dimension that can be imaged by lithography, which may be larger than a minimum target feature size (F) of a line or space for a particular process technology. If an element, such as a line or a space, in the final integrated circuit is smaller than the minimum dimensions that can be imaged by lithography for a given semiconductor process technology, it may be said to be sub-lithographic in size. A variety of techniques may be used to create sub-lithographic features, such as a set of lines and spaces having dimensions that are sub-lithographic, to create a sub-lithographic pitch, including the self-aligned double patterning technique described in FIG. 4A-F. As an example, in a 32 nano-meter (nm) semiconductor process technology, the minimum target feature size 'F' may be about 32 nm, allowing for a minimum pitch of about 64 nm. If standard lithographic techniques using single develop-etch processes were to be used, feature sizes of about 40-45 nm might be obtained using a state-of-the-art 98 nm lithographic immersion tool. But by using a more mature 128 nm lithographic tool capable of printing 64 nm features, final target feature sizes of about 32 nm may be created using self-aligned double patterning techniques. This means that the final integrated circuit may have the minimum target feature dimension of about 32 nm (F) with minimum pitch as 64 nm (2F), even though the minimum lithographic feature size is about 64 nm (2F) with minimum pitch 128 nm (4F), so a sub-lithographic pitch would be any pitch less than about 128 nm for that embodiment.

The cross-point memory array 110 in the embodiment shown includes PCMS memory cells. Only a small number of PCMS cells are shown in FIG. 1, but various embodiments may include any number of memory cells organized as any number of columns by any number of rows, with any number of layers of memory cells. A PCMS memory cell may include a phase change memory (PCM) element 112 that is made of a phase change material, such as a chalcogenide alloy. An access device 114 may also be included which may be a ovonic threshold switch (OTS), a semiconductor diode, or transistor, or any other device capable of regulating the flow of current through the PCM element 112. The PCMS memory cell may be coupled between two control lines such as one of the word lines 116 and one of the bit lines 118, 120. The control lines 116, 118, 120 may be made of any conductive material, but may be a metal in some embodiments.

Word lines 116 are routed parallel to the y-axis on a layer below the memory cells of the memory array 110, and may exit the array on one end or the other, depending on the embodiment. Bit lines 118, 120 are routed parallel to the x-axis on a layer above the memory cells of the memory array 110. The quad of bit lines 118 may exit the array in the '+x' direction and the quad of bit lines 120 exits the array in the '−x' direction as shown. In the embodiment shown the word lines 116 and bit lines 118, 120 are routed at a first pitch that is sub-lithographic. The actual pitch may vary between embodiments and as lithographic technologies change over time, sub-lithographic limits may decrease over time.

After the bit lines 120 exit the array area, they turn in the '−y' direction to create perpendicular sections 122. The spacing of the perpendicular sections 122 may be greater than the pitch of the bit lines 120 as they traverse the array 110. A quad of leads 130 may come from the '−x' direction toward the array 110 on a different layer than the bit lines 120. The leads 130 may be coupled to circuitry to control the memory array 110. In some embodiments, the leads 130 may be on a layer that is below, or is closer to the substrate than, the layer of the bit lines 120 and may have a pitch that is twice as large as the pitch of the bit lines 120. So if the bit lines have a pitch of '2F', the leads may have a pitch of '4F'. In many embodiments, the pitch of the leads may be equal to or larger than the lithographic minimum.

Bit lines 120 may be coupled to the quad of leads 130 by vias 140. The area where the bit lines 120 turn to form perpendicular second 122 and where the vias 140 are located may be referred to as a compact socket area, or simply socket area. The two perpendicular sections 122 closest to the edge of the socket area entered by the leads 130, which may be thought of as the first two perpendicular sections 122 to be encountered by the quad of leads 130 as they head toward the array 110, may be coupled to the two middle leads of the quad of leads 130. The two perpendicular sections 122 farthest from the edge of the socket area entered by the leads 130, which may be thought of as the second two perpendicular sections 122 to be encountered by the quad of leads 130, may be coupled to the outer two leads of the quad of leads 130. The outer two leads of the quad of leads 130 may turn toward each other to allow the vias 140 to couple to the second two perpendicular sections 122.

Figure 2:
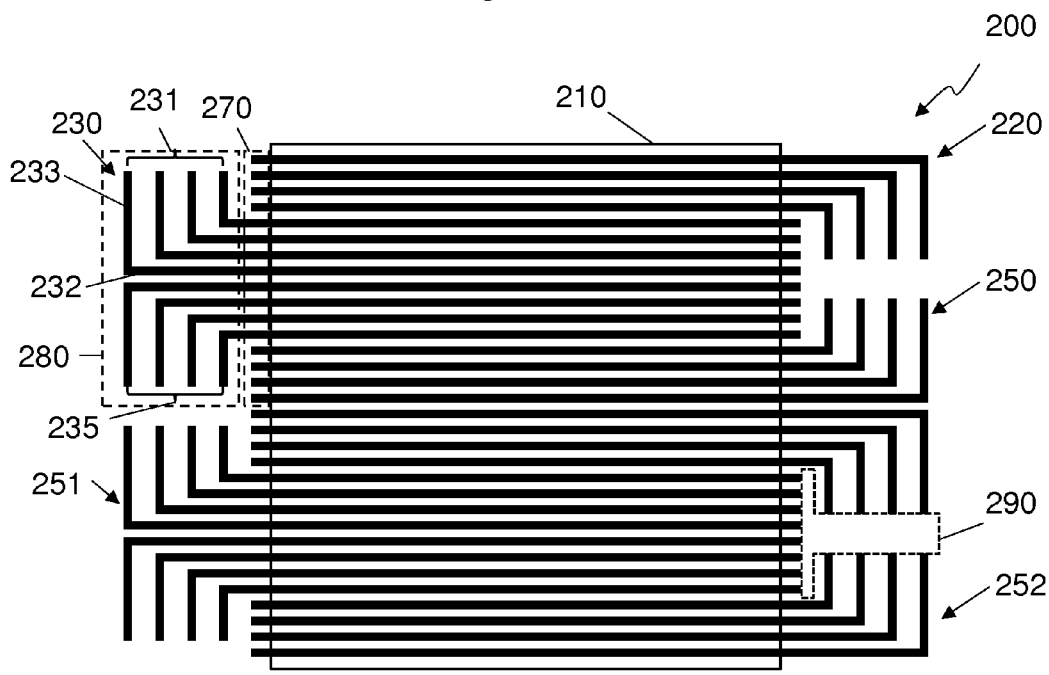
FIG. 2 is a diagram of an embodiment of control lines traversing a cross-point array.

FIG. 2 is a diagram of an embodiment of control lines traversing a cross-point array 210. A single layer 200 may be shown. The lines shown may be thought of as word lines or bit lines or any other type of control line. A cross-point array 210 is traversed by groups of lines such as the first group of lines 220, the second group of lines 230, the third group of lines 250, a fourth group of lines 251 and a fifth group of lines 252. Alternating groups of lines may be routed outside of the array 210 on opposite sides of the array 210 where the lines may be coupled to leads (not shown). In the example shown, the first group of lines 220, the third group of lines 250, and the fifth group of lines 252 are routed to the right side of the array 210. The second group of lines 230 and the fourth group of lines 251 are routed to the left side of the array 210. The group of lines may be routed to a socket area to be coupled to the leads, such as the socket area 280 for the second group of lines 230. A group of lines, such as group 230, may include two quads of lines, such as quad 231 and quad 235. The two quads of lines 231, 235 may turn away from each other in the socket area 280 to create perpendicular sections, such as perpendicular section 233 of line 232.

The lines may be formed at a sub-lithographic pitch using a technique such as shown in FIG. 4A-F. In some technologies, the lines may be formed as loops which are cut at some stage of processing. The cut mask 290 may be one embodiment of a chop mask. Chop masks are described in more detail in the discussion of FIG. 4E. In such embodiments, the ends of the lines opposite from where the lines exit the array 210 may be cut in a chop area, such as chop area 270, which is positioned between the socket area 280 and the array 210. Alternate groups of lines may terminate in the chop area, such as the group 220 and half of group 250 which terminate in the chop area 270.

Although the embodiments shown couple a quad of lines to a quad of leads, other embodiments may use different sized groups of lines and leads. In other embodiments, groups of 4 may be routed to opposite sides of the array and a pair of lines may be coupled with a pair of leads in a similar manner to that shown for quads in FIG. 1. In some embodiments, larger groups, such as 16 lines may be used, with octets of lines coupled to octets of leads.

Figure 3:
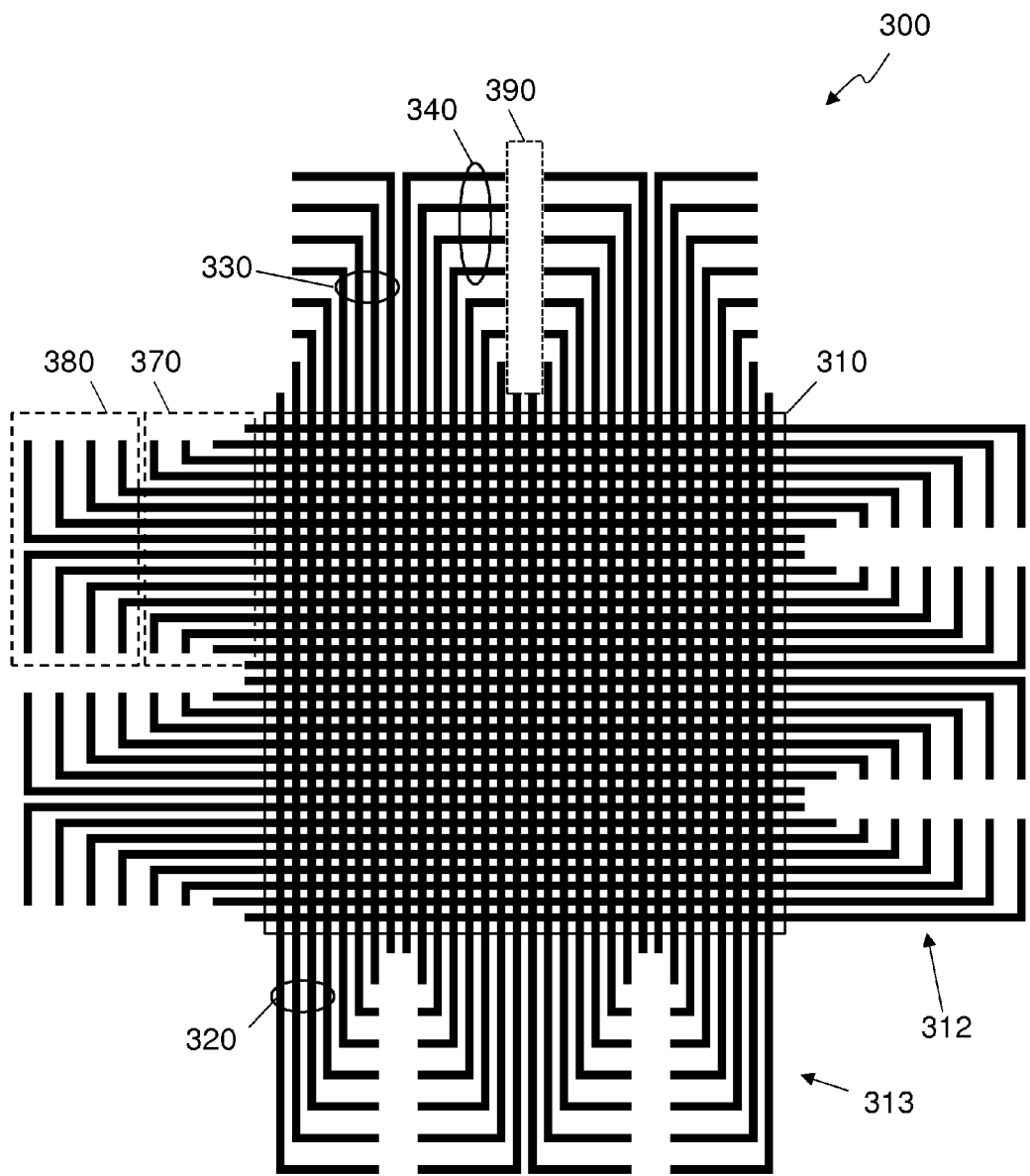
FIG. 3 is a diagram of an embodiment of control lines traversing a cross-point array showing two sets of control lines that are perpendicular.

FIG. 3 is a diagram of an embodiment of control lines traversing a cross-point array 310 showing two sets of control lines that are perpendicular. Two layers may be shown as a unified image 300. A set of bit lines 313 may traverse the array 310 on one layer in one direction, while a set of word lines 312 may traverse the array 310 on another layer in a perpendicular direction. Alternate groups of lines may be coupled to leads on opposite sides of the array. As an example, quad of bit lines 320 may couple to leads on one side of the array 310, such as on the bottom of the image 300, while the group of bits including quad 330 and quad 340 may couple to other leads on the other side of the array 310. Alternating groups of lines may couple to the leads in the socket area 380 and be terminated in the chop area 370. The shape of the lines that terminate in the chop area 370 may vary between embodiments, with a different chop mask 390 shown in FIG. 3 than the chop mask 290 of FIG. 2.

Figure 4A:
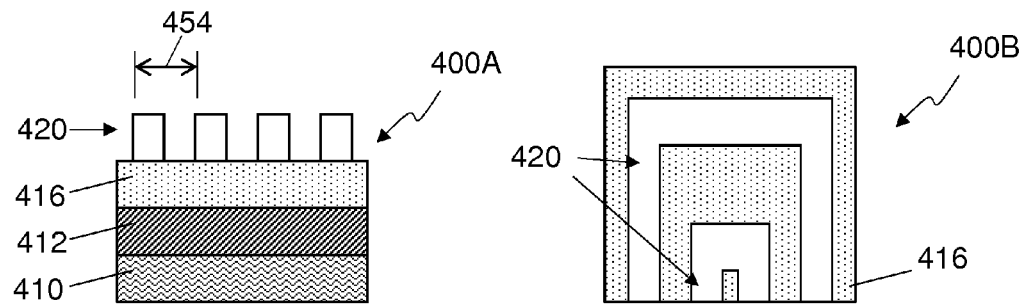
FIG. 4A-F show stages of an embodiment of self-aligned double patterning to create lines at a sub-lithographic pitch.

FIG. 4A-F show stages of an embodiment of self-aligned double patterning to create lines at a sub-lithographic pitch. The various stages shown include a cross sectional image 'A' and a top view 'B'. FIG. 4A shows a work-in-progress (WIP)

IC 400A/B. The WIP IC 400A shows a substrate 410, which may be made of any type of material or materials, depending on the embodiment, but may include various conducting, semiconducting, and insulating layers and/or areas and may include various types of circuitry and or materials, including metal-oxide-semiconductor field-effect transistors (MOSFET) and/or phase change material. In some embodiments, the substrate 410 may include individual stacks of material to form PCMS cells and/or other control lines formed using self-aligned double patterning processes. A metal layer 412 may be deposited on the substrate 410 and an etch stop layer 416 may be deposited on the metal layer 412. Core material may be deposited, imaged, and etched to form the loops 420 as may be seen on the WIP IC 400B. The core material may be formed with some dimensions at a minimum lithographic feature size of '2F' to create lines at a pitch of '4F' 454.

Figure 4B:
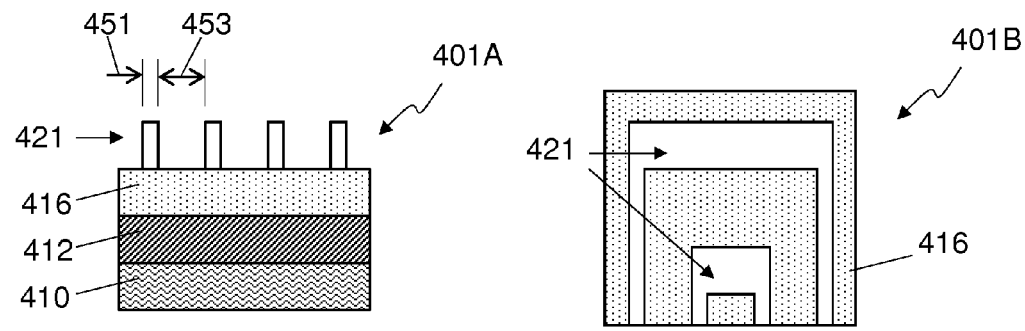
Figure 4C:
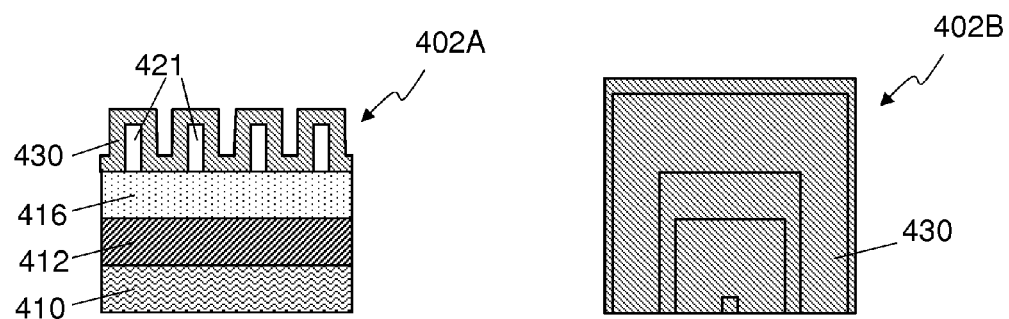
Figure 4D:
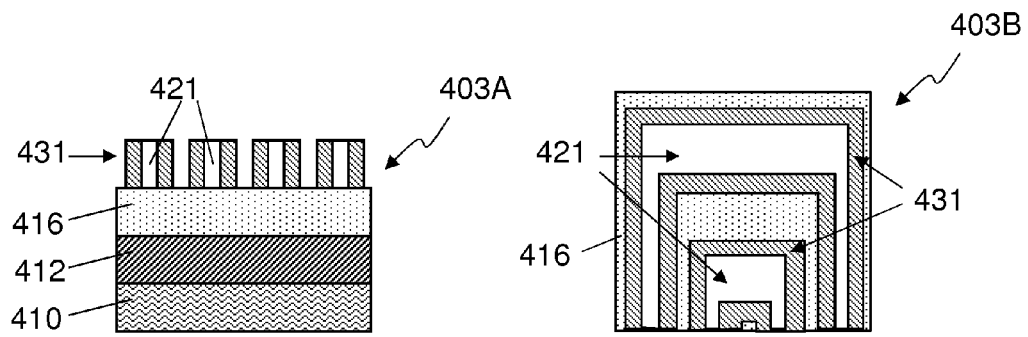
Figure 4E:
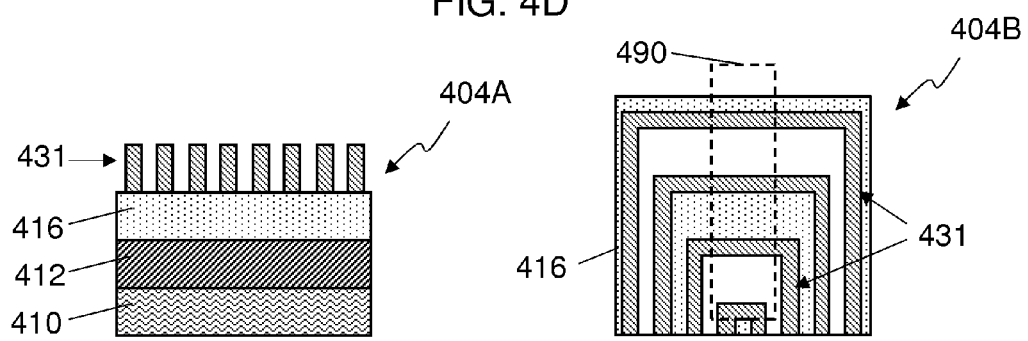
Figure 4F:
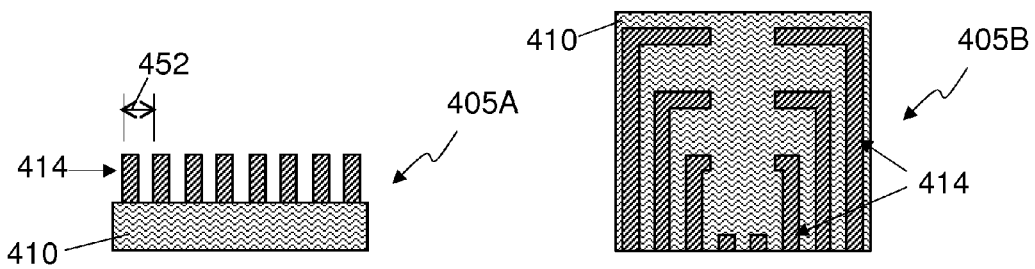

The core material 420 may then be trimmed back as shown by the core material 421 shown in WIP IC 401A/B in FIG. 4B. The core material 420 may be trimmed by about 'F' so that the minimum dimensions of the core material 421 may be about 'F' 451 with spacing of about '3F' 453. A layer of spacer material 430 may be deposited on the WIP IC 401A/B to create WIP IC 402A/B of FIG. 4C. The spacer material 430 may be about 'F' thick and be deposited over the core material 421. Some of the spacer material 430 may be removed, leaving the spacer material 431 on the sidewalls of the core material 421 to form WIP IC 403A/B of FIG. 4D. The core material 421 may then be removed to leave spacers 431 on WIP IC 404A/B in FIG. 4E. Etching may be used to pattern the metal layer 412 into lines 414 to match the spacers 431 and create WIP IC 405A/B. The lines 414 may have a minimum feature size that is sub-lithographic due to the self-aligning double patterning process used. In the embodiment shown, the pitch may be about '2F' 452 with lines 414 about 'F' wide and spaces about 'F' wide. The lines 414 may be representative of lines for embodiments.

Depending on the embodiment, a chop mask 490 may be applied before or during the processes used to form WIP IC 403A/B, WIP IC 404A/B, or WIP IC 405 A/B, to cut the loops of the spacers 431 or metal lines 414. Different chop masks may be used to minimize locations that the spacers 431 or metal lines 414 are cut with tight dimensions.

Figure 5:
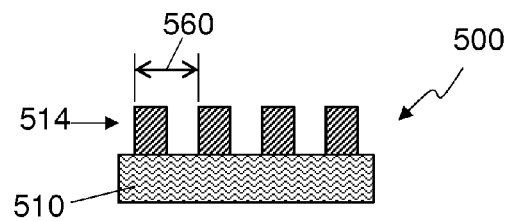
FIG. 5 shows an example of lines created at a lithographic minimum.

FIG. 5 shows an example of lines 514 created at a lithographic minimum. The lines 514 may be formed with standard lithographic and etching processes on a substrate 510 to form IC 500. The pitch may be about '4F' 560, which may be the lithographic minimum of about '2F' wide lines 514 with about '2F' wide spaces. The lines 514 may be representative of leads for embodiments.

Figure 6:
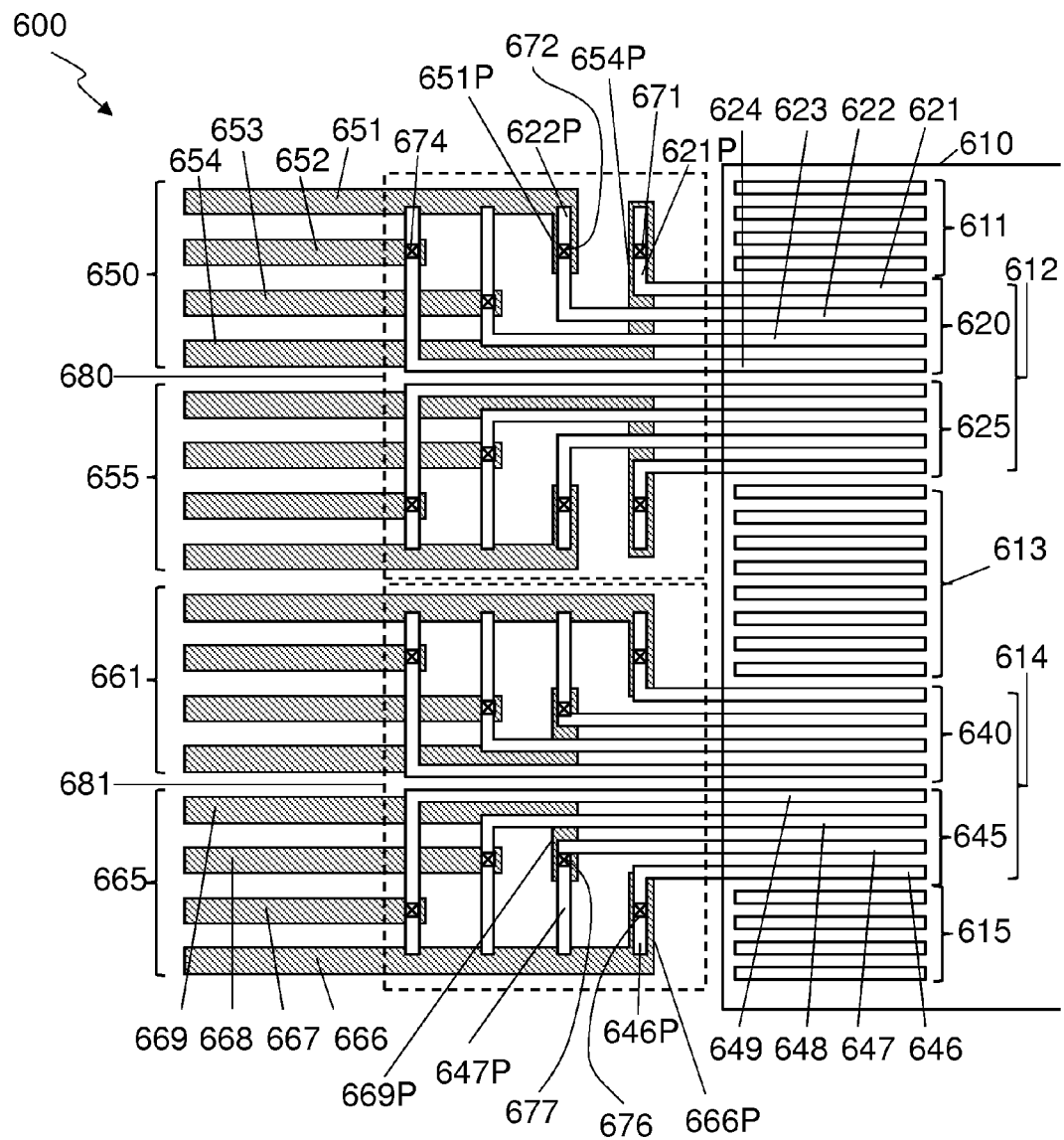
FIG. 6 is a diagram of embodiments of a compact socket.

FIG. 6 is a diagram of embodiments of a compact socket in an IC 600. A cross-point array 610 is traversed by groups of lines 611, 612, 613, 614, 615 that are routed outside of the array area on alternate sides of the array 610. One group of lines 612 that exits the array 610 on the side shown in FIG. 6 includes two contiguous quads of lines 620, 625. The first quad of lines 620 includes line 621, line 622, line 623 and line 624, that may be routed across the array at a sub-lithographic pitch '2F' with lines that are about 'F' wide and spaces that are about 'F' wide. The second quad of lines 625 includes four lines that are adjacent to the first quad of lines 620. The two quads of lines 620, 625 are routed out of the array area 610 and into a socket area 680, where the two quads turn away from each other to create perpendicular sections. Line 621 turns to form perpendicular section 621P, line 622 turns to form perpendicular section 622P, line 623 turns to form a perpendicular section, and line 622 turns to form a perpendicular section, on the same layer as used for the group of lines 612 to traverse the array 610 and without intersecting with any other lines. The pitch of the perpendicular sections may be greater than the sub-lithographic pitch used by the lines 612 to traverse the array, and may include a space of '2F' or greater in some embodiments. The perpendicular sections may end at a distance more than '2F', or distance equal to or greater than the pitch of the lines 612, from the side of the socket area 680 in some embodiments.

The socket area 680 may be adjacent to the array in some embodiments, although other embodiments may include a chop area, or some other space, between the socket area 680 and the array 610. Although two quads of lines, or 8 lines, may enter the socket area 680, the socket area 680 may have a width that is 16 times the pitch of the lines 612 or '32F', with the group of lines 612 entering in the middle of the socket area 680. In some embodiments, the socket area may be further divided into two socket areas that are 8F wide and may be used to couple one quad of lines to one quad of leads.

In the embodiments shown in FIG. 6, the leads 650-665 enter the socket areas 680, 681 on a side opposite from the array 610. The leads 650-665 are on a different layer than the lines 612, 614 and may be routed at a pitch of about '4F' that is twice as large as the pitch of the lines 612. Two quads of leads 650, 655 may enter the socket area 680, where they are coupled to the two quads of lines 620, 625 by vias between the layer of the lines 612 and the layer of the leads 650, 655. In socket area 680, the quad of leads 650 enters a side of the socket area 680 that is opposite from where the quad of lines 620 enters the socket area 680. The middle two leads 652, 653 are coupled to the first two perpendicular sections of the lines encountered, perpendicular sections of lines 624, 623, which are farther from the array than the perpendicular sections 622P, 621P. The outer two leads 651, 654 bend toward each other in the socket area 680, with lead farthest from the center of the group of lines, lead 651, bending to create an orthogonal section 651P, between line 652 and the orthogonal section 654P of lead 654. The orthogonal section 651P of outer lead 651 of the quad of leads 650 is coupled to the perpendicular section 622P of the line 622 of the quad of lines 620 by via 672. The orthogonal section 654P of outer lead 654 of the quad of leads 650 is coupled to the perpendicular section 621P of the line 621 of the quad of lines 620 by via 671.

The quad of leads 655 also enters the socket area 680 and is coupled to the quad of lines 625. The routing paths of the quad of leads 655 may be a mirror image of the routing paths of the quad of leads 650, and the routing paths of the quad of lines 625 may be a mirror image of the routing paths of the quad of lines 620.

An alternative embodiment of a compact socket connection to a cross point array is shown in socket area 681. A group of lines 614, including quad 640 and quad 645 enters the socket area 681 from the side closest to the array 610. The quad of lines 645 turns away from the quad of lines 640 in the socket area 681 to form perpendicular sections. So line 646 turns to form perpendicular section 646P, line 647 turns to form perpendicular section 647P, line 648 turns to form a perpendicular section, and line 649 turns to form a perpendicular section. A group of leads including quad 661 and quad 665 enters the socket area 681 from the side opposite the array 610. The outer two leads 666, 669 of quad 665 bend toward each other in the socket area with the lead 669 closest to the center of the group of lines 614 bending to create an orthogonal section 669P that is located between line 668 and an orthogonal section 666P of lead 666. The middle two leads 667, 668 are coupled to the first two perpendicular sections of lines encountered, the perpendicular sections of line 649 and line 648, by vias. The outer two leads are coupled to the two perpendicular sections 647P, 646P closest to the array 610, with lead 666 coupled to line 646 by via 676, and lead 669 coupled to line 647 by via 677. The routing of the quad of leads 665 may not allow for as much space between the vias and the surrounding unconnected leads and lines as the routing of the quad of leads 650.

Figure 7:
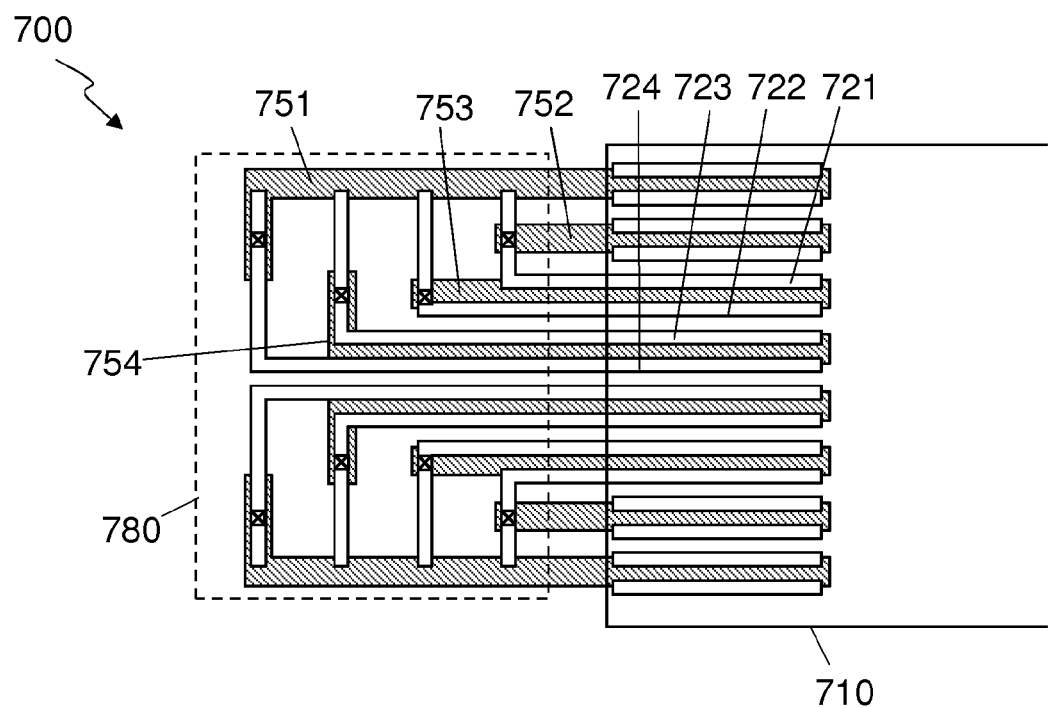
FIG. 7 is a diagram of an alternative embodiment of a compact socket.

FIG. 7 is a diagram of an alternative embodiment of a compact socket in IC 700, which is similar to the routing of quad 665 in FIG. 6. Circuitry, coupled to leads 751-754, may be located under a cross-point array 710 which may be traversed by lines 721-724. The lines 721-724 enter the socket area 780 on a side that is closest to the array 710 and bend to create perpendicular sections. The leads 751-754 enter the socket area 780 from the same side as the leads 721-724. The middle two leads 752, 753 are coupled to the first two perpendicular sections encountered, the perpendicular sections of lines 721, 722. The outer two leads 751, 754 are coupled to the second two perpendicular sections encountered, the perpendicular sections of lines 724, 723, which are farther from the array 710 than the first to perpendicular sections.

Figure 8:
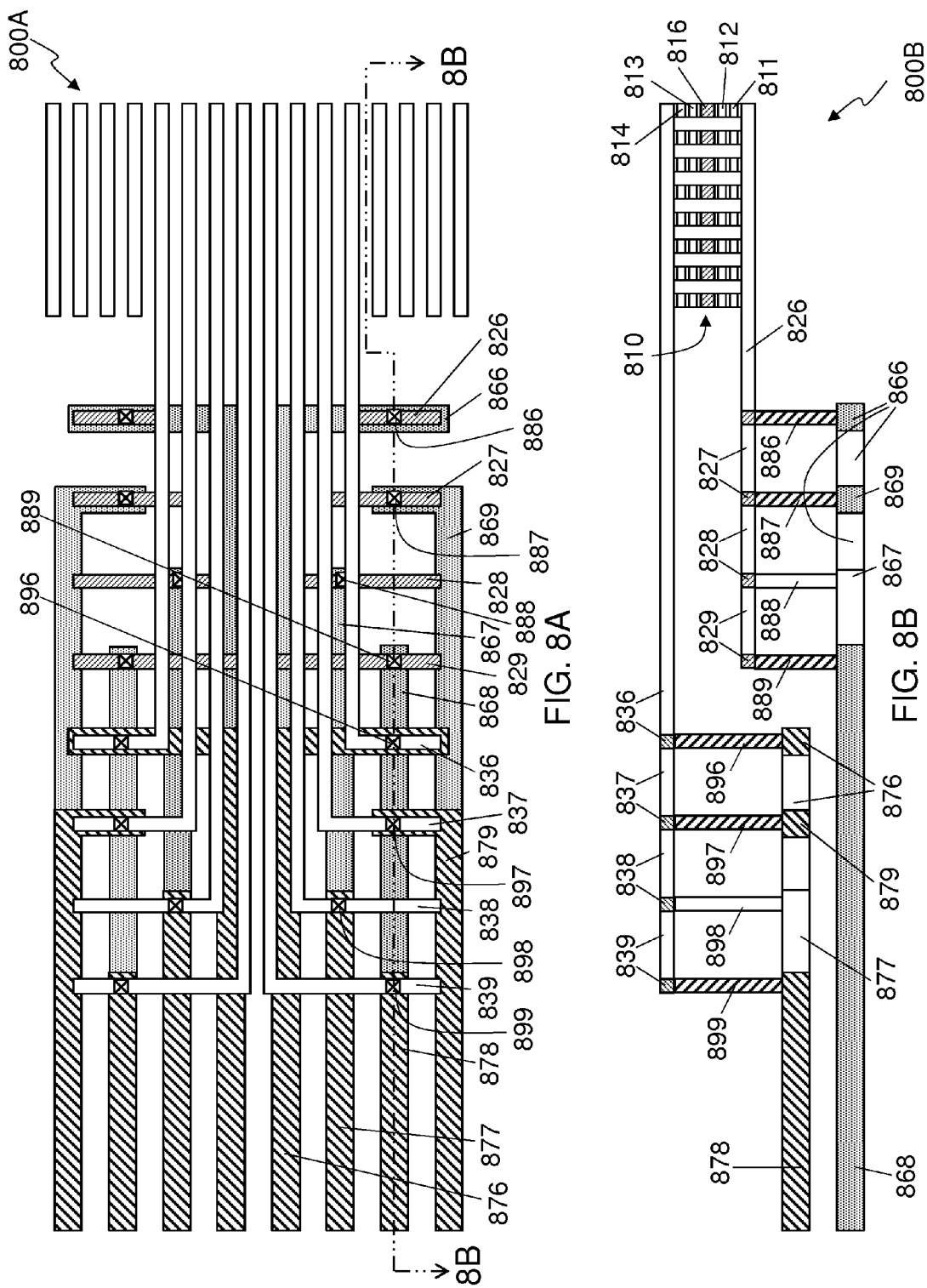
FIG. 8A-B show a top view and a cross-sectional view of an embodiment of compact sockets for a three-dimensional cross-point array.

FIG. 8A-B show a top view 800A and a cross-sectional view 800B of an embodiment of compact sockets for a three-dimensional (3D) cross-point array 810. The cross-section 800B is located at the cut line 8B:8B of the top view 800A, which is staggered between the array 810 and the socket areas to show more detail. The 3D array 810 may include stacked memory cells, which may be PCMS memory cells in some embodiments such as that shown. An example of stacked memory cells may include a first PCM cell 812 and access device 811, which may be coupled between the word line 826 and the bit line 816. A second PCM cell 813 and access device 814 may be stacked on the first cell and may be coupled between the bit line 816 and word line 836. Word lines 836-838 may traverse the array 810 at a sub-lithographic pitch on a first layer in the top view 800A, with the other word lines 826-829 on a third layer not visible from the top view. The word lines 826-829, 836-839 may turn away from adjacent bit lines in the socket area to form perpendicular sections.

Leads 876-879 are routed toward the array on a second layer at a pitch that is twice the pitch of the lines 836-839 and leads 886-889 are routed toward the array on a fourth layer at a pitch that is twice the pitch of the lines 826-829. Lead 876 and lead 879 bend toward each other and are coupled to line 836 and line 837 by via 896 and via 897, respectively. Lead 877 is coupled to line 838 by via 898 and lead 878 is coupled to line 839 by via 899. Lead 866 and lead 869 bend toward each other and are coupled to line 826 and line 827 by via 886 and via 887, respectively. Lead 867 is coupled to line 828 by via 888 and lead 868 is coupled to line 829 by via 889.

The order of the layers shown in FIG. 8B is one possible stack-up on an integrated circuit using an embodiment of a compact socket, with the layers of the leads 876-879, 866-869 below the layers of the array 810 and lines 826-829, 836-839. Other stack-ups may be possible depending on the direction that the various groups of leads are routed away from the socket area. In at least one embodiment, where leads 866-869 are routed under the array 810, and leads 876-879 are routed away from the array 810, the second layer routing the leads 876-879 may be the same as the fourth layer 866-869.

Figure 9:
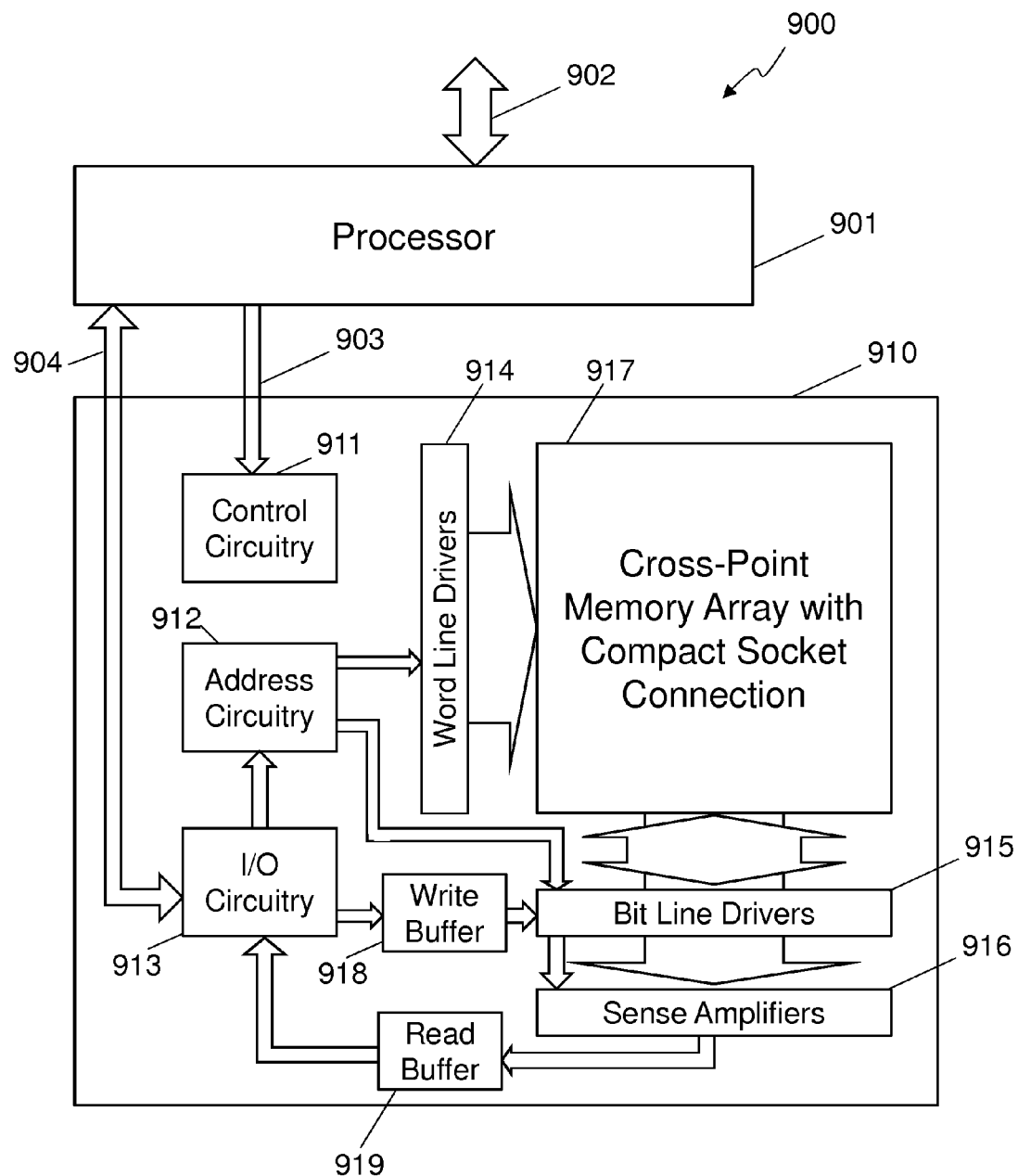
FIG. 9 is a block diagram of an electronic system using an embodiment.

FIG. 9 is a block diagram of an electronic system 900 using an embodiment of a compact socket connection in a cross-point array memory 917. A processor 901 is coupled to the memory device 910 with control/address lines 903 and data lines 904. In some embodiments, data and control may utilize the same lines. The processor 901 may be an external microprocessor, microcontroller, or some other type of external controlling circuitry. In some embodiments, the processor 901 may be integrated in the same package or even on the same die as the memory device 910. In some embodiments, the processor 901 may be integrated with the control circuitry 911, allowing some of the same circuitry to be used for both functions. The processor 901 may have external memory, such as random access memory (RAM) and read only memory (ROM), used for program storage and intermediate data or it may have internal RAM or ROM. In some embodiments, the processor may use the memory device 910 for program or data storage. A program running on the processor 901 may implement many different functions including, but not limited to, an operating system, a file system, defective chunk remapping, and error management.

In some embodiments an external connection 902 is provided. The external connection 902 is coupled to the processor 901 and allows the processor 901 to communicate to external devices. Additional I/O circuitry may be used to couple the external connection 902 to the processor 901. If the electronic system 900 is a storage system, the external connection 902 may be used to provide an external device with non-volatile storage. The electronic system 900 may be a solid-state drive (SSD), a USB thumb drive, a secure digital card (SD Card), or any other type of storage system. The external connection 902 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If the electronic system 900 is a computing system, such as a mobile telephone, a tablet, a notebook computer, a set-top box, or some other type of computing system, the external connection 902 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 910 may include an array 917 of memory cells. The memory cells may be organized as a two dimensional or a three dimensional cross-point array and may be a phase change memory (PCM), a phase change memory with switch (PCMS) a resistive memory, nanowire memory, ferro-electric transistor random access memory (FeTRAM), flash memory, or any other type of memory constructed as a cross-point array. The cross-point array may be coupled to the word line drivers 914 and/or bit line drivers 915, and/or sense amplifiers, using compact socket connections as described herein. Address lines and control lines 903 may be received and decoded by control circuitry 911, I/O circuitry 913 and address circuitry 912 which may provide control to the memory array 917. I/O circuitry 913 may couple to the data lines 904 allowing data to be received from and sent to the processor 901. Data read from the memory array 917 may be temporarily stored in read buffers 919. Data to be written to the memory array 917 may be temporarily stored in write buffers 918 before being transferred to the memory array 917.

The system illustrated in FIG. 9 has been simplified to facilitate a basic understanding of the features of the memory. Many different embodiments are possible including using a single processor 902 to control a plurality of memory devices 910 to provide for more storage space. Additional functions, such as a video graphics controller driving a display, and other devices for human oriented I/O may be included in some embodiments.

Examples of various embodiments are described in the following paragraphs:

An example integrated circuit may include lines that traverse a cross-point array, the lines fabricated at a first sub-lithographic pitch on a first layer. An example of an integrated circuit may also include leads on a second layer, the leads having a second pitch that is about twice as large as the first pitch. In the example of an integrated circuit, the lines are routed outside of the array in alternating groups to opposite sides of the array where the lines couple to the leads. In some examples of an integrated circuit, a group of lines may include two contiguous quads of lines that turn away from each other to create perpendicular sections in a socket area that is 16 times as wide as the first pitch, and the group of lines is coupled to two quads of leads by vias between the first and second layers in the socket area. In some examples of an integrated circuit, the socket area is adjacent to the array. In some examples of an integrated circuit, the perpendicular sections end at a distance equal to at least the first pitch from a side of the socket area. In some examples of an integrated circuit, a group of leads may include the two quads of leads, routing paths of one quad of lines in the group of lines are a mirror image of routing paths of another quad of lines in the group of lines, and routing paths of one quad of leads in the group of leads is a mirror image of routing paths of another quad of leads in the group of leads. Some examples of an integrated circuit may also include a chop area positioned between the socket area and the array, wherein alternate groups of lines terminate in the chop area. In some examples of an integrated circuit, the alternate groups of lines are coupled to other leads on an opposite side of the array from the socket area. In some examples of an integrated circuit, a quad of lines is coupled to a quad of leads, the quad of leads including a middle two leads and an outer two leads, the perpendicular sections include a first two perpendicular sections closest to a side of the socket area where the leads enter the socket area and a second two perpendicular sections farthest to the side of the socket area where the leads enter the socket area, the middle two leads enter the socket area and are respectively coupled to the first two perpendicular sections, and the outer two leads enter the socket area, turn toward each other, and are coupled to the second two perpendicular sections. In some examples of an integrated circuit, the quad of leads enters a side of the socket area that is opposite from where the quad of lines enters the socket area, and the first two perpendicular sections are farther from the array than the second two perpendicular sections. In some examples of an integrated circuit, the quad of leads and the quad of lines enter a side of the socket area closest to the array, and the first two perpendicular sections are closer to the array than the second two perpendicular sections. In some examples of an integrated circuit, a lead, of the outer two leads, farthest from a center of the group of lines, bends between at least one of the inner two leads and another lead of the outer two leads. Some examples of an integrated circuit may also include at least two more quads of lines that traverse the cross-point array on a third layer at the first pitch using the line doubling process, wherein the first pitch is sub-lithographic, and at least two more quads of leads on a fourth layer at the second pitch. In some examples of an integrated circuit, the at least two more quads of lines turn away from each other to create more perpendicular sections in a second socket area that is located between the array and the socket area, and the at least two more quads of lines are coupled to the at least two more quads of leads by vias between the third and fourth layers in the second socket area; and the array may include at first array of memory cells coupled to the at least two more quads of lines, and a second array of memory cells, stacked on the first array of memory cells, coupled to the lines. In some examples of an integrated circuit, the array may include phase change memory cells coupled to the lines. In some examples of an integrated circuit, the phase change memory cells may include phase change material and an access device. Some examples of an integrated circuit may also include a substrate upon which the array is fabricated, wherein the first layer is farther from the substrate than the second layer. Any combination of the examples of this paragraph may be used in embodiments.

An example integrated circuit may include a cross-point memory array including a first set of four contiguous lines and a second set of four contiguous lines adjacent to the first set of lines, wherein the first and second sets of lines cross the array at a first pitch, which is sub-lithographic, on a first layer, a set of four leads on a second layer at a pitch that is twice as large as the first pitch, the set of leads including a middle two leads and an outer two leads, and a socket area located outside of an area containing the array, aligned with the first and second set of lines, and having a width equal to eight times the first pitch. In some example integrated circuits, the first set of lines extend into the socket area and bend toward the second set of lines to create a first two perpendicular sections and a second two perpendicular sections, the second set of lines terminate before entering the socket area, the middle two leads enter the socket area and are respectively coupled to the first two perpendicular sections by a first two vias between the first and second layers, and the outer two leads enter the socket area and turn inwardly, and are coupled to the second two perpendicular sections by a second two vias between the first and second layers. In some example integrated circuits, the set of leads enters a side of the socket area that is opposite from where the first set of lines enters the socket area, and the first two perpendicular sections are farther from the array than the second two perpendicular sections. In some example integrated circuits, the set of lines and the first set of leads enter a side of the socket area closest to the array, and the first two perpendicular sections are closer to the array than the second two perpendicular sections. In some example integrated circuits, a lead of the outer two leads closest to the second set of lines bends between at least one of the inner two leads and another lead of the outer two leads. In some example integrated circuits, the memory array may include phase change memory cells coupled to the first and second sets of lines. Some example integrated circuits may include a first area comprising the socket area, the set of leads, and the first and second set of lines, and a second area, adjacent to the first area, comprising a mirror image of the first area. Some example integrated circuits may include a third set of four contiguous lines and a fourth set of four contiguous lines adjacent to the third set of lines, wherein the first and second sets of lines cross the array at the first pitch on a third layer that is farther from the substrate than the second layer, and are substantially aligned with the first and second set of lines, a second set of four leads on a fourth layer that is closer to the substrate than the second layer, at the pitch that is twice as large as the first pitch, the second set of leads including a second middle two leads and a second outer two leads, a second socket area, aligned with the third and fourth set of lines, and having a width equal to eight times the first pitch. In some example integrated circuits, the first socket area is positioned between the second socket area and the array, the third set of lines extend into the second socket area and bend toward the fourth set of lines to create a third two perpendicular sections and a fourth two perpendicular sections, the fourth set of lines terminate before entering the second socket area, the second middle two leads enter the second socket area and are respectively coupled to the third two perpendicular sections by a third two vias between the third and fourth layers, and the second outer two leads enter the socket area and turn inwardly, and are coupled to the fourth two perpendicular sections by a fourth two vias between the third and fourth layers. Any combination of the examples of this paragraph may be used in embodiments.

An example system may include a processor to generate memory control commands, and at least one memory, coupled to the processor, to respond to the memory control commands, the at least one memory as described in one of the two preceding paragraphs. Some examples of an integrated circuit may also include I/O circuitry, coupled to the processor, to communicate with an external device. Any combination of the examples of this paragraph and the examples of the previous two paragraphs may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. An integrated circuit comprising:
   lines that traverse a cross-point array, the lines having a sub-lithographic first pitch on a first layer;
   leads on a second layer, the leads having a second pitch that is about twice as large as the first pitch; and
   a socket area wherein a group of the lines have sections extending in a same perpendicular direction from the group of lines to couple in the socket area with an outer set of the leads that extend toward each other and an inner set of parallel leads;
   wherein the lines are routed outside of the array in alternating groups to opposite sides of the array to couple to the leads.

2. The integrated circuit of claim 1, wherein a group of lines comprises two contiguous quads of lines that turn away from each other to create perpendicular sections in the socket area that is 16 times as wide as the first pitch, and the group of lines is coupled to two quads of leads by vias between the first and second layers in the socket area.

3. The integrated circuit of claim 2, wherein the socket area is adjacent to the array.

4. The integrated circuit of claim 2, wherein the perpendicular sections end at a distance equal to at least the first pitch from a side of the socket area.

5. The integrated circuit of claim 2, wherein a group of leads comprises the two quads of leads;
   routing paths of one quad of lines in the group of lines are a minor image of routing paths of another quad of lines in the group of lines; and
   routing paths of one quad of leads in the group of leads is a mirror image of routing paths of another quad of leads in the group of leads.

6. The integrated circuit of claim 2, further comprising a chop area positioned between the socket area and the array, wherein alternate groups of lines terminate in the chop area.

7. The integrated circuit of claim 6, wherein the alternate groups of lines are coupled to other leads on an opposite side of the array from the socket area.

8. The integrated circuit of claim 2, wherein a quad of lines is coupled to a quad of leads, the quad of leads including a middle two leads and an outer two leads,
   the perpendicular sections include a first two perpendicular sections closest to a side of the socket area where the leads enter the socket area and a second two perpendicular sections farthest to the side of the socket area where the leads enter the socket area;
   the middle two leads enter the socket area and are respectively coupled to the first two perpendicular sections; and
   the outer two leads enter the socket area, turn toward each other, and are coupled to the second two perpendicular sections.

9. The integrated circuit of claim 8, wherein the quad of leads enters a side of the socket area that is opposite from where the quad of lines enters the socket area, and the first two perpendicular sections are farther from the array than the second two perpendicular sections.

10. The integrated circuit of claim 8, wherein the quad of leads and the quad of lines enter a side of the socket area closest to the array, and the first two perpendicular sections are closer to the array than the second two perpendicular sections.

11. The integrated circuit of claim 8, wherein a lead, of the outer two leads, farthest from a center of the group of lines, bends between at least one of the inner two leads and another lead of the outer two leads.

12. The integrated circuit of claim 2, further comprising:
   at least two more quads of lines that traverse the cross-point array on a third layer at the first pitch;
   at least two more quads of leads on a fourth layer at the second pitch;
   wherein the at least two more quads of lines turn away from each other to create more perpendicular sections in a second socket area that is located between the array and the socket area, and the at least two more quads of lines are coupled to the at least two more quads of leads by vias between the third and fourth layers in the second socket area; and
   the array comprises at first array of memory cells coupled to the at least two more quads of lines, and a second array of memory cells, stacked on the first array of memory cells, coupled to the lines.

13. The integrated circuit of claim 1, wherein the array comprises phase change memory cells coupled to the lines.

14. The integrated circuit of claim 13, wherein the phase change memory cells comprise phase change material and an access device.

15. The integrated circuit of claim 1, further comprising a substrate upon which the array is fabricated, wherein the first layer is farther from the substrate than the second layer.

16. A system comprising:
a processor to generate memory control commands; and
at least one memory, coupled to the processor, to respond to the memory control commands, the at least one memory comprising:
lines that traverse a cross-point array, the lines having a sub-lithographic first pitch on a first layer;
leads on a second layer, the leads having a second pitch that is about twice as large as the first pitch; and
a socket area wherein a group of the lines have sections extending in a same perpendicular direction from the group of lines to couple in the socket area with an outer set of the leads that extend toward each other and an inner set of parallel leads;
wherein the lines are routed outside of the array in alternating groups to opposite sides of the array to couple to the leads.

17. The system of claim 16, wherein a group of lines comprises two contiguous quads of lines that turn away from each other to create perpendicular sections in the socket area that is 16 times as wide as the first pitch, and the group of lines is coupled to two quads of leads by vias between the first and second layers in the socket area.

18. The system of claim 17, wherein a group of leads comprises the two quads of leads;
routing paths of one quad of lines in the group of lines are a minor image of routing paths of another quad of lines in the group of lines; and
routing paths of one quad of leads in the group of leads is a mirror image of routing paths of another quad of leads in the group of leads.

19. The system of claim 17, wherein a quad of lines is coupled to a quad of leads, the quad of leads including a middle two leads and an outer two leads,
the perpendicular sections include a first two perpendicular sections closest to a side of the socket area where the leads enter the socket area and a second two perpendicular sections farthest to the side of the socket area where the leads enter the socket area;
the middle two leads enter the socket area and are respectively coupled to the first two perpendicular sections; and
the outer two leads enter the socket area, turn toward each other, and are coupled to the second two perpendicular sections.

20. The system of claim 19, wherein a lead, of the outer two leads, farthest from a center of the group of lines, bends between at least one of the inner two leads and another lead of the outer two leads.

21. The system of claim 17, further comprising:
at least two more quads of lines that traverse the cross-point array on a third layer at the first pitch;
at least two more quads of leads on a fourth layer at the second pitch;
wherein the at least two more quads of lines turn away from each other to create more perpendicular sections in a second socket area that is located between the array and the socket area, and the at least two more quads of lines are coupled to the at least two more quads of leads by vias between the third and fourth layers in the second socket area;
the third and fourth layers are located between the first and second layers; and
the array comprises at first array of memory cells coupled to the at least two more quads of lines, and a second array of memory cells, stacked on the first array of memory cells, coupled to the lines.

22. The system of claim 16, wherein the array comprises phase change memory cells coupled to the lines.

23. The system of claim 16, further comprising I/O circuitry, coupled to the processor, to communicate with an external device.

24. An integrated circuit comprising:
a cross-point memory array including a first set of four contiguous lines and a second set of four contiguous lines adjacent to the first set of lines, wherein the first and second sets of lines cross the array at a first pitch, which is sub-lithographic, on a first layer;
a set of four leads on a second layer at a pitch that is twice as large as the first pitch, the set of leads including a middle two leads and an outer two leads; and
a socket area located outside of an area containing the array, aligned with the first and second set of lines, and having a width equal to eight times the first pitch;
wherein the first set of lines extend into the socket area and bend toward the second set of lines to create a first two perpendicular sections and a second two perpendicular sections;
the middle two leads enter the socket area and are respectively coupled to the first two perpendicular sections by a first two vias between the first and second layers; and
the outer two leads enter the socket area, turn inwardly, and are coupled to the second two perpendicular sections by a second two vias between the first and second layers.

25. The integrated circuit of claim 24, wherein the set of leads enters a side of the socket area that is opposite from where the first set of lines enters the socket area, and the first two perpendicular sections are farther from the array than the second two perpendicular sections.

26. The integrated circuit of claim 24, wherein the set of leads and the first set of lines enter a side of the socket area closest to the array, and the first two perpendicular sections are closer to the array than the second two perpendicular sections.

27. The integrated circuit of claim 24, wherein a lead of the outer two leads closest to the second set of lines bends between at least one of the inner two leads and another lead of the outer two leads.

28. The integrated circuit of claim 24, wherein the memory array comprises phase change memory cells coupled to the first and second sets of lines.

29. The integrated circuit of claim 24, further comprising:
a first area comprising the socket area, the set of leads, and the first and second set of lines; and
a second area, adjacent to the first area, comprising a mirror image of the first area.

30. The integrated circuit of claim 24, further comprising:
a third set of four contiguous lines and a fourth set of four contiguous lines adjacent to the third set of lines, wherein the first and second sets of lines cross the array at the first pitch on a third layer, and are substantially aligned with the first and second set of lines;
a second set of four leads on a fourth layer at the pitch that is twice as large as the first pitch, the second set of leads including a second middle two leads and a second outer two leads; and a second socket area, aligned with the third and fourth set of lines, and having a width equal to eight times the first pitch;

wherein the first socket area is positioned between the second socket area and the array;

the third set of lines extend into the second socket area and bend toward the fourth set of lines to create a third two perpendicular sections and a fourth two perpendicular sections;

the second middle two leads enter the second socket area and are respectively coupled to the third two perpendicular sections by a third two vias between the third and fourth layers; and the second outer two leads enter the socket area and turn inwardly, and are coupled to the fourth two perpendicular sections by a fourth two vias between the third and fourth layers.

\* \* \* \* \*